United States Patent
Hwang et al.

(10) Patent No.: US 10,622,561 B2
(45) Date of Patent: Apr. 14, 2020

(54) VARIABLE RESISTOR, NON-VOLATILE MEMORY DEVICE USING THE SAME, AND METHOD OF FABRICATING THEREOF

(71) Applicant: Seoul National University R&DB foundation, Seoul (KR)

(72) Inventors: Cheol Seong Hwang, Seoul (KR); Jung Ho Yoon, Seoul (KR)

(73) Assignee: Seoul National University R&DB foundation, Seoul (KR)

( * ) Notice: Subject to any disclaimer, the term of this patent is extended or adjusted under 35 U.S.C. 154(b) by 0 days.

(21) Appl. No.: 15/198,825

(22) Filed: Jun. 30, 2016

(65) Prior Publication Data
US 2017/0005262 A1    Jan. 5, 2017

(30) Foreign Application Priority Data
Jun. 30, 2015  (KR) ................. 10-2015-0093780

(51) Int. Cl.
*H01L 45/00*    (2006.01)
*H01L 27/24*    (2006.01)

(52) U.S. Cl.
CPC ........ *H01L 45/146* (2013.01); *H01L 27/2463* (2013.01); *H01L 45/08* (2013.01); *H01L 45/10* (2013.01); *H01L 45/1233* (2013.01); *H01L 45/1253* (2013.01); *H01L 45/1616* (2013.01); *H01L 45/1625* (2013.01)

(58) Field of Classification Search
CPC ............................ H01L 45/10; H01L 45/1633
See application file for complete search history.

(56) References Cited

U.S. PATENT DOCUMENTS

| | | | | |
|---|---|---|---|---|
| 2011/0227020 A1* | 9/2011 | Sekar | ..... | H01L 45/145 257/2 |
| 2012/0091418 A1* | 4/2012 | Chen | ..... | H01L 45/08 257/4 |
| 2014/0009998 A1* | 1/2014 | Schloss | ..... | G11C 11/5685 365/148 |

(Continued)

OTHER PUBLICATIONS

Lee et al. "Low Power and High Speed Bipolar Switching with a Thin Reactive Ti Buffer Layer in Robust HfO2 based RRAM" Electron Devices Meeting (IEDM), 2008 IEEE International, Feb. 27, 2009, pp. 297-298.*

(Continued)

*Primary Examiner* — Matthew L Reames
*Assistant Examiner* — John A Bodnar

(57) ABSTRACT

Provided are a semiconductor technique, and more particularly, to a variable resistor, a non-volatile memory device using the same, and a method of fabricating the same. The variable resistor may include a first electrode including titanium (Ti); a second electrode for forming a Schottky barrier; and a stacked structure including an oxygen-deficient hafnium oxide film ($HfO_{2-x}$, $0<x<2$) between the first electrode and the second electrode, an oxygen-deficient titanium oxide ($TiO_x$) film between the oxygen-deficient hafnium oxide film and the first electrode, and a stoichiometric tantalum oxide ($Ta_2O_5$) film between the oxygen-deficient hafnium oxide film and the second electrode.

7 Claims, 11 Drawing Sheets

(56) References Cited

U.S. PATENT DOCUMENTS

2014/0241031 A1\* 8/2014 Bandyopadhyay ......................... G11C 11/5692
                                                                  365/96
2016/0260479 A1\* 9/2016 Ode ................... G11C 13/0007

OTHER PUBLICATIONS

Lee et al. "Low Power and High Speed Bipolar Switching with a Thin Reactive Ti Buffer Layer in Robust HfO2 based RRAM" Electron Devices Meeting (IEDM), 2008 IEEE International, Feb. 27, 2009, pp. 297-298 (Year: 2009).\*

\* cited by examiner

VARIABLE RESISTOR, NON-VOLATILE MEMORY DEVICE USING THE SAME, AND METHOD OF FABRICATING THEREOF

CROSS-REFERENCE TO RELATED APPLICATION

This application claims priority of Korean Patent Application No. 10-2015-0093780, filed on Jun. 30, 2015, in the KIPO (Korean Intellectual Property Office), the disclosure of which is incorporated herein entirely by reference.

BACKGROUND OF THE INVENTION

Field of the Invention

The present disclosure relates to a semiconductor technique, and more particularly, to a variable resistor, a non-volatile memory device using the same, and a method of fabricating the same.

Description of the Related Art

Recently, as demands for portable digital application devices, such as digital cameras, personal digital assistants (PDAs), and mobile phones, increase, markets for non-volatile memories are rapidly expanding. One of the most popular examples of programmable non-volatile memory devices is a NAND flash memory. Although density of integration of non-volatile memory devices is increasing based on multi-level cell (MLC) embodiments, it is reaching to scaling-down limits. Therefore, a resistive memory device (ReRAM) using a variable resistor having a reversibly changeable resistance is being spotlighted as a non-volatile memory that may replace the NAND flash memory. Since a resistance of the variable resistor is a physical characteristic that may be used as a data state and power consumption is low relatively to another non-volatile memories, a low-power memory device having a simplified cell configuration may be realized by using the ReRAM.

The ReRAM generally requires an electroforming process in order to obtain a reversible resistance change with a low power and generally has two resistance states including a low level (referred to as low resistance state, i.e., LRS) and a high level (referred to as high resistance state, i.e., HRS). If the resistive memory device does not require an electroforming process, has three or more resistance levels like a MLC NAND flash, and has a self-rectification characteristic in order to embody a crossbar array structure without any current steering devices, the resistive memory device may more easily replace a MLC NAND flash.

SUMMARY OF THE INVENTION

The present invention provides a reliable variable resistor that has three or more resistances, does not require an electroforming process, does not require a complicated peripheral circuit, and exhibits self-rectification characteristic and low power consumption with a simple structure.

The present invention also provides a non-volatile memory including a variable resistor having the above-stated advantages.

The present invention also provides a method of fabricating a variable resistor having the above-stated advantages.

According to an aspect of the present invention, a variable resistor may include a first electrode comprising titanium (Ti); a second electrode for forming a Schottky barrier; and a stacked structure comprising an oxygen-deficient hafnium oxide film ($HfO_{2-x}$, $0<x<2$) between the first electrode and the second electrode, an oxygen-deficient titanium oxide ($TiO_x$) film between the oxygen-deficient hafnium oxide film and the first electrode, and a stoichiometric tantalum oxide ($Ta_2O_5$) film between the oxygen-deficient hafnium oxide film and the second electrode.

In an example, the second electrode may include iridium (Ir), palladium (Pd), platinum (Pt), gold (Au), ruthenium (Ru), or an alloy thereof. The first electrode may be a top electrode, and the second electrode may be a bottom electrode.

The hafnium oxide film may have a monoclinic crystalline structure, and the tantalum oxide film may have an amorphous structure. A resistive switching may occur when a bias is applied to the second electrode having a potential higher than that of the first electrode. In addition, no current may flow until a voltage difference exceeds a predetermined value when potential of the second electrode is lower than that of the first electrode.

The resistive switching is adjusted by trapping and de-trapping of charges at trap centers formed in the hafnium oxide film. The trapping of charges may be allocated to a set state, and the de-trapping of charges may be allocated to a reset state.

According to other aspect of the present invention, a non-volatile memory device may include an array of memory cells. Each of the memory cells may include the variable resistor of claim 1 as a data storage element.

In an example, the array of memory cells may have a cross-point structure. The non-volatile memory device may further include an external resistor connected to the array of memory cells in parallel.

According to another aspect of the present invention, a method of fabricating a variable resistor may include forming a first electrode comprising titanium; forming a hafnium oxide film on the first electrode; and forming a tantalum oxide film on the hafnium oxide film. In the forming of the hafnium oxide film or the forming of the tantalum oxide film, the first electrode may be partially oxidized, an oxygen-deficient hafnium oxide film may be formed between the first electrode and the hafnium oxide film, and the hafnium oxide film may be transformed to the oxygen-deficient hafnium oxide film.

The hafnium oxide film may be formed in a self-limiting process deposition, and the tantalum oxide film may be formed in a defect-inducing self-limiting process deposition for inducing an oxygen vacancy in the underlying hafnium oxide film.

The self-limiting process deposition may be thermal atomic layer deposition, and the defect-inducing self-limiting process deposition may be plasma-enhanced atomic layer deposition. The hafnium oxide film may have a monoclinic crystalline structure, and the tantalum oxide film may have an amorphous structure.

According to embodiments, based on a reactive first electrode that may be oxidized, a second electrode for forming a Schottky barrier, and a stacked structure including an oxygen-deficient hafnium oxide film ($HfO_{2-x}$, $0<x<2$) between the first electrode and the second electrode, an oxygen-deficient titanium oxide ($TiO_x$) film between the oxygen-deficient hafnium oxide film and the first electrode, and a stoichiometric tantalum oxide ($Ta_2O_5$) film between the oxygen-deficient hafnium oxide film and the second electrode, a reliable variable resistor that has three or more resistances (e.g., 8 resistance states), does not require an electroforming process, does not require a complicated peripheral circuit, and exhibits self-rectification characteristic and low power consumption with a simple structure and a non-volatile memory including the variable resistor may be provided.

Furthermore, according to another embodiment, during formation of the hafnium oxide film or formation of the tantalum oxide film, the first electrode is partially oxidized, an oxygen-deficient hafnium oxide film is formed between the first electrode and the hafnium oxide film, and the hafnium oxide film is transformed to the oxygen-deficient hafnium oxide film. As a result, a multilayer structure is formed between the first electrode and the second electrode. Therefore, a reliable method of fabricating a variable resistor having the above-stated advantages may be provided.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

Figure 1A:
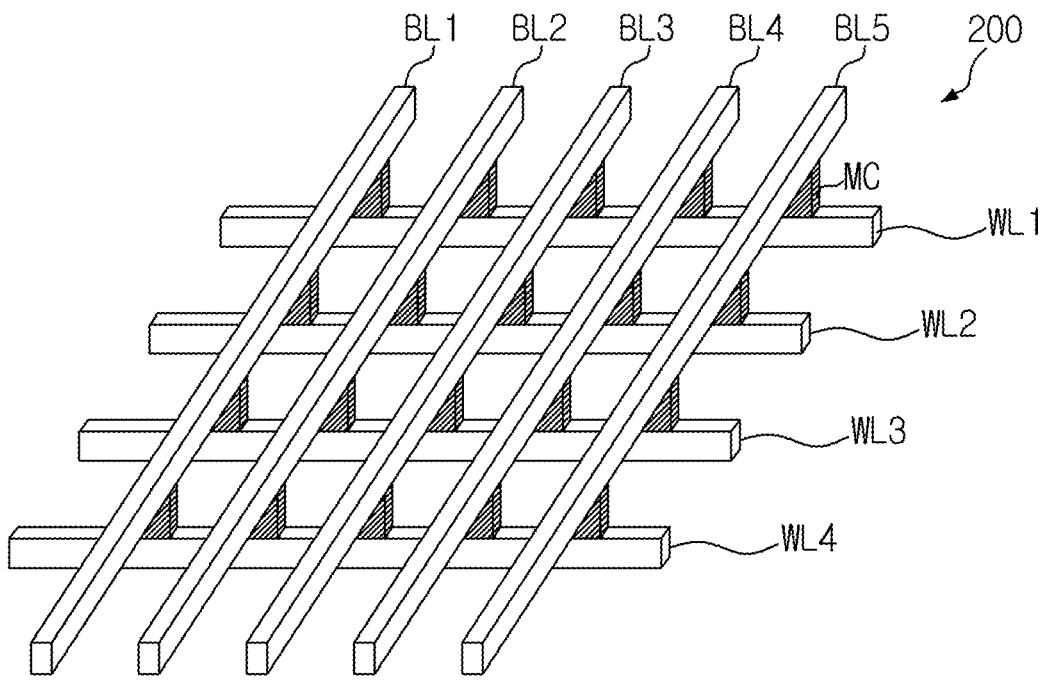
FIG. 1A is a perspective view of a non-volatile memory device having a cross-point array according to an embodiment.
Figure 1B:
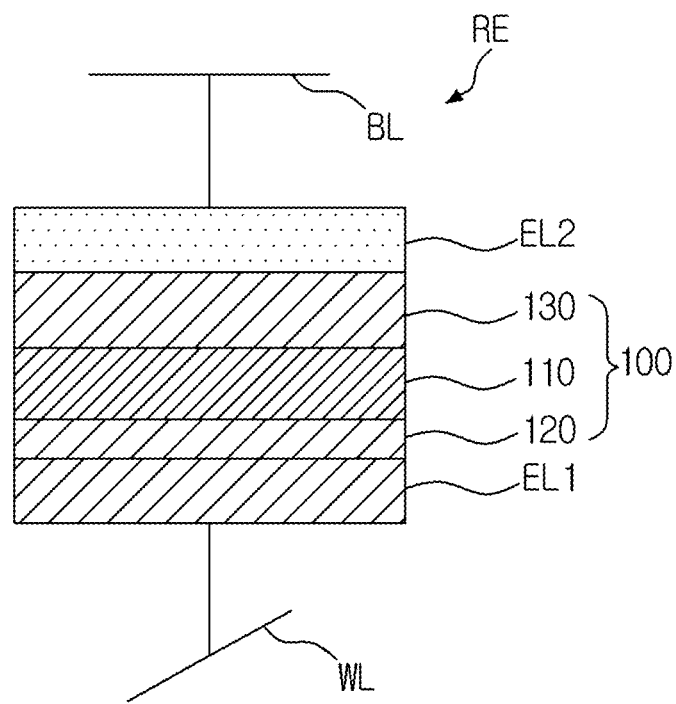
FIG. 1B is a sectional view of a variable resistor according to an embodiment.

FIG. 1A is a perspective view of a non-volatile memory device 200 having a cross-point array according to an embodiment, and FIG. 1B is a sectional view of a variable resistor RE according to an embodiment.

Referring to FIG. 1A, the non-volatile memory device 200 may include an array of memory cells MC that are arranged in a plurality of rows and a plurality of columns. A set of conductive electrodes (referred to hereinafter as word-lines; WL1 through WL4) extend onto an end of the array of the memory cells MC. Each word-line may be electrically connected to memory cells MC of a corresponding row. Another set of conductive electrodes (referred to hereinafter as bit-lines; BL1 through BL5) may extend onto the other end of the array of the memory cells MC. Each bit-line may be electrically connected to memory cells MC of a corresponding column.

In the non-volatile memory device 200, each memory cell MC is disposed at an intersection of one word-line and one bit-line. A read operation and a write operation regarding a particular memory cell (referred to hereinafter as a selected memory cell) may be performed by activating a word-line and a bit-line combined with the selected memory cell MC.

The non-volatile memory device 200 may further include a word-line control circuit (not shown) that is coupled with the memory cells MC via respective word-lines and activates a selected word-line for reading or writing a selected memory cell MC. According to an embodiment, the word-line control circuit may include a multiplexer (not shown) for selecting a particular word-line from among word-lines.

The non-volatile memory device 200 may further include a bit-line control circuit (not shown) that is coupled with the memory cells MC via respective bit-lines BL1 through BL5. According to an embodiment, the bit-line control circuit may include a de-multiplexer, a detector circuit, and an input/output (I/O) pad. The de-multiplexer may be configured to selectively couple a bit-line of a selected memory cell with the detector circuit.

The word-line control circuit and the bit-line control circuit may activate a corresponding word-line and a corresponding bit-line that are coupled with a selected memory cell and independently access memory cells. During a write operation, the word-line control circuit writes data to the selected memory cell by applying a certain voltage to a selected word-line. The de-multiplexer may activate the selected memory cell by electrically grounding the selected memory cell, for example. In this case, a current which can affect characteristics of a selected memory cell flows to the selected memory cell and writes logic values.

Each memory cell includes a variable resistor (RE of FIG. 1B). The logic values may be stored based on resistance states of the variable resistor RE, where various multi-bit logic values may be stored according to the number of resistance states. The change of the resistance is detected in a follow-up read operation.

During a read operation, the word-line control circuit applies a certain voltage to a selected word-line, and the de-multiplexer may couple a selected bit-line to a detector circuit. A logic value of a selected memory cell is detected based on values of a current detected by the detector circuit, where a resulting value of it may be transmitted to an I/O pad.

Width and/or value of a voltage pulse transmitted through a selected memory cell for programming or reading the selected memory cell is/are adjusted, and thus resistance of the selected memory cell is adjusted. As a result, a particular logic state may be written or read out. Since a read operation may be affected by a leakage current generated by memory cells adjacent to another selected memory cell, each memory cell may include a reverse diode that is connected to a variable resistor in series, according to an embodiment. The reverse diode may be interposed between a memory cell and a word-line or between a memory cell and a bit-line. The reverse diode may function as a selecting device for isolating a selected memory cell from unselected memory cells adjacent thereto.

The reverse diode may be a Zener diode. Threshold voltage $V_{th}$ of the reverse diode may be smaller than a write voltage. In this case, during the writing operation on a selected memory cell, a current can flow through the selected memory cell and the reverse diode serially connected with the selective memory cell, where a reverse current can be blocked by inhibit voltages applied to adjacent memory cells. In an example, a read voltage may be smaller than the threshold voltage $V_{th}$ of the reverse diode. For example, the read voltage may be half of the threshold voltage $V_{th}$ of the reverse diode. In an example, selection of a memory cell in a cross-point structure may be performed according to a half selection method, but the examples of the present invention is not limited thereto.

According to an embodiment, if a variable resistor has a self-rectification characteristic, a rectification characteristic of such a reverse diode may be embodied by the variable resistor in itself. In this case, the reverse diode may be omitted, and thus configuration and fabrication of a semiconductor memory device may be further simplified. Although the non-volatile memory device according to the above embodiment includes a single layer memory cell array, it is merely an example, and the examples of the present invention is not limited thereto. For example, two or more memory cell arrays may be stacked and integrated. Furthermore, although FIG. 1A exemplifies a memory cell array expanding in horizontal directions with respect to a semiconductor substrate, a 3-dimensional memory cell array that expands in vertical directions with respect to the semiconductor substrate may also be provided.

Referring to FIG. 1B, a variable resistor may include a first electrode EL1 and a second electrode EL2. The first electrode EL1 may be a reactive metal that may be oxidized. For example, the first electrode EL1 may be a titanium (Ti) electrode. The second electrode EL2 includes a metal having a work function of 5 eV or higher to form a Schottky barrier and may include a non-reactive noble metal. For non-restrictive example, the second electrode EL2 may include iridium (Ir), palladium (Pd), platinum (Pt), gold (Au), ruthenium (Ru), or an alloy thereof. According to an embodiment, the first electrode EL1 may be a bottom electrode, whereas the second electrode EL2 may be a top electrode. Furthermore, the first electrode EL1 and the second electrode EL2 may be electrically coupled with a word-line and a bit-line, respectively. The first electrode EL1 and the second electrode EL2 may be integrated as one-body with a word-line and a bit-line, respectively.

The variable resistor RE may have a stacked structure including an oxygen-deficient hafnium oxide ($HfO_{2-x}$) film 110 between the first electrode EL1 and the second electrode EL2, an oxygen-deficient titanium oxide ($TIO_x$) film 120 between the oxygen-deficient hafnium oxide film 110 and the first electrode EL1, and a stoichiometric tantalum oxide ($Ta_2O_5$) film 130 between the oxygen-deficient hafnium oxide film 110 and the second electrode EL2. The X is any number satisfying 0<x<2.

Although the present embodiment relates to the variable resistors RE stacked in a vertical direction, in other example, the variable resistors RE may be stacked in a horizontal direction in a 3-dimensional vertical non-volatile memory device. In this case, each layer of the variable resistors RE may be stacked in concentric ring shape.

As described below, the variable resistor RE has an electronic resistance switching mechanism. Since the electronic resistance switching mechanism attributes to an electron trapping/de-trapping mechanism, the electronic resistance switching mechanism is more preferable in view of power consumption and reliability than an ion resistance switching mechanism. The ion resistance switching mechanism attributes to a defect. Furthermore, since a resistance value may be adjusted based on an amount of trapped/detrapped carriers in the variable resistor RE, a memory cell MC including the variable resistor RE may be programmed or erased by using a conventional incremental step pulse programming (ISPP) technique.

Furthermore, the variable resistor RE may have 8 uniform resistance values. It has been confirmed that resistances may be reversibly changed in the variable resistor RE accompanied with a self-rectification characteristic regardless of no electroforming operation.

Figure 2:
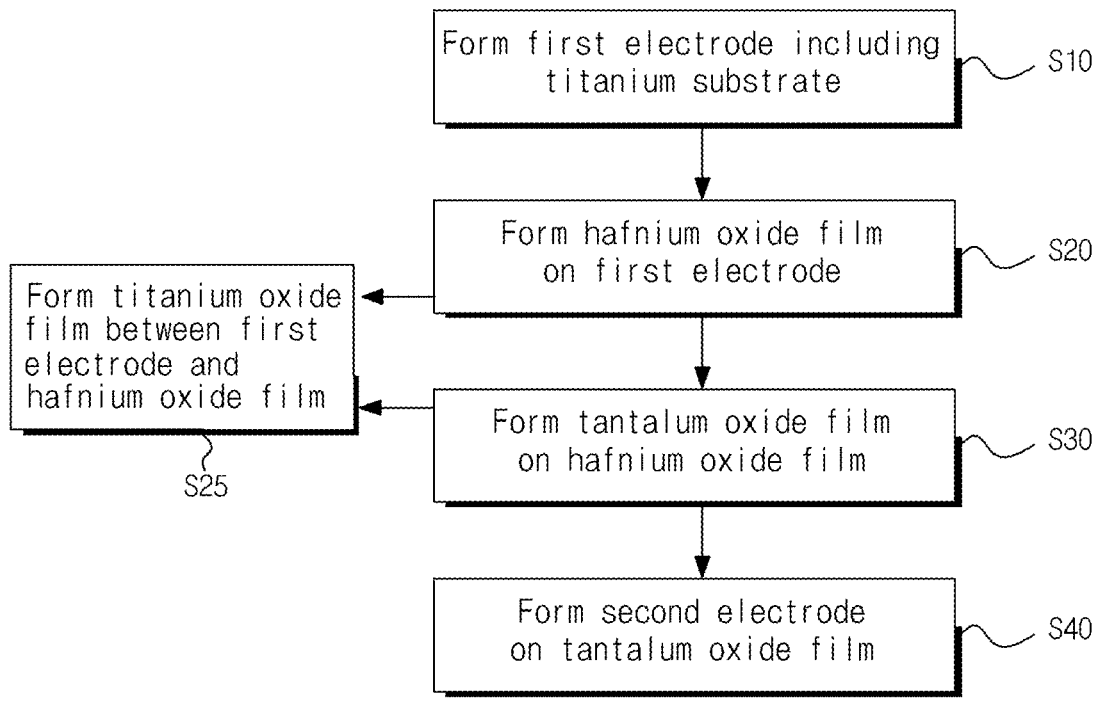
FIG. 2 is a flowchart for describing a method of fabricating a variable resistor according to an embodiment.

FIG. 2 is a flowchart for describing a method of fabricating a variable resistor according to an embodiment.

Referring to FIG. 2, a first electrode including titanium may be formed on a substrate (Step S10). A metal thin-film forming process based on a physical or chemical deposition technique may be applied to the formation of the first electrode. A hafnium oxide film may be formed on the first electrode (Step S20). Next, a tantalum oxide film may be formed on the hafnium oxide film (Step S30).

According to an embodiment, as the hafnium oxide film is formed in the step S20, the first electrode may be partially oxidized from the exposed top surface of the first electrode to a certain depth, and thus an oxygen-deficient titanium oxide (TiO$_x$) film may be formed between the first electrode EL1 and the hafnium oxide film. Here, the formed hafnium oxide film is transformed to an oxygen-deficient hafnium oxide (HfO$_{2-x}$) film (Step S25). The formation of the oxygen-deficient titanium oxide film and the transformation to the oxygen-deficient hafnium oxide film may occur during deposition of the hafnium oxide film or during a heat treatment process after the formation of the hafnium oxide film.

According to another embodiment, in the step S30 for forming the tantalum oxide film, a defect may be induced at the underlying hafnium oxide, and thus the exposed top surface of the first electrode may be partially oxidized to a certain depth. As a result, the oxygen-deficient titanium oxide (TiO$_x$) film may be formed between the first electrode and the hafnium oxide film, where the hafnium oxide film may be transformed to an oxygen-deficient hafnium oxide (HfO$_{2-x}$) film (step S25). The formation of the oxygen-deficient titanium oxide film and the transformation to the oxygen-deficient hafnium oxide film may occur during deposition of the tantalum oxide film or during a heat treatment operation after the formation of the tantalum oxide film.

The hafnium oxide film may be formed by using a stoichiometric self-limiting process deposition method in order to form a titanium oxide under the hafnium oxide film. Since the oxygen deficiency of the titanium oxide film and the hafnium oxide film is caused by the consumption of oxygen for forming the titanium oxide by the oxygen constituting the hafnium oxide (HfO$_2$) film, the total amount of oxygen in the oxygen-deficient hafnium oxide film (HfO$_{2-x}$) and the oxygen-deficient titanium oxide (TiO$_x$) may be identical to oxygen concentration of the hafnium oxide (HfO$_2$) film deposited by a self-limiting process.

According to an embodiment, the oxygen-deficient hafnium oxide film and the oxygen-deficient titanium oxide film may be formed during the deposition of a tantalum oxide film. To this end, the tantalum oxide film may be deposited by using a defect-inducing self-limiting process method such as a plasma-enhanced atomic layer deposition.

Next, a second electrode may be formed on the tantalum oxide film to form a Schottky barrier layer, e.g., a platinum layer (Step S40). The second electrode may be formed in a sputtering or a chemical vapor deposition. However, the example of the present invention is not limited thereto.

Figure 3A:
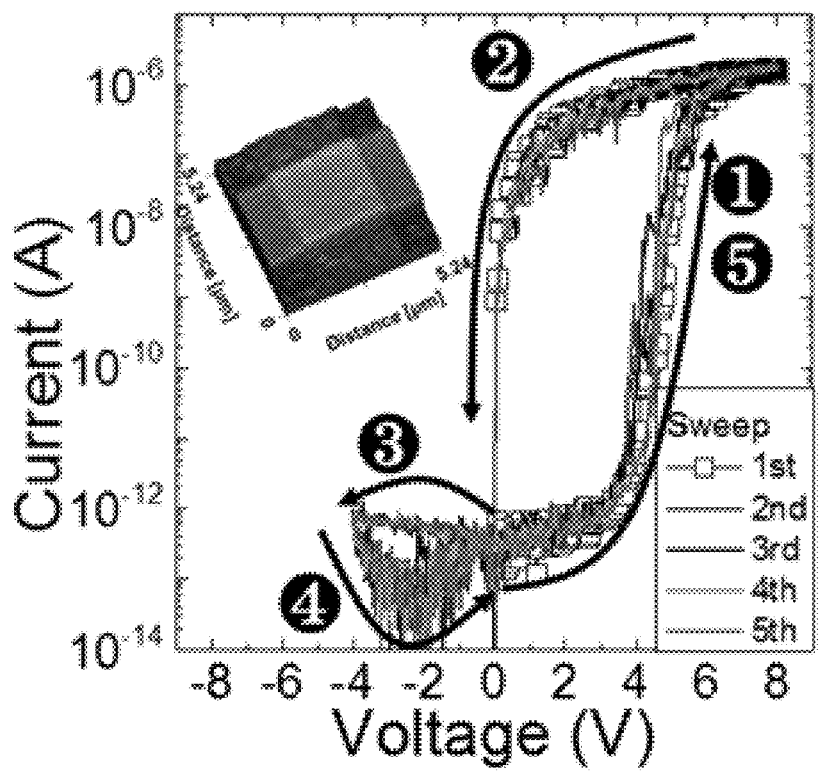
FIGS. 3A through 3E are graphs showing electric characteristics of a variable resistor according to an embodiment.
Figure 3B:
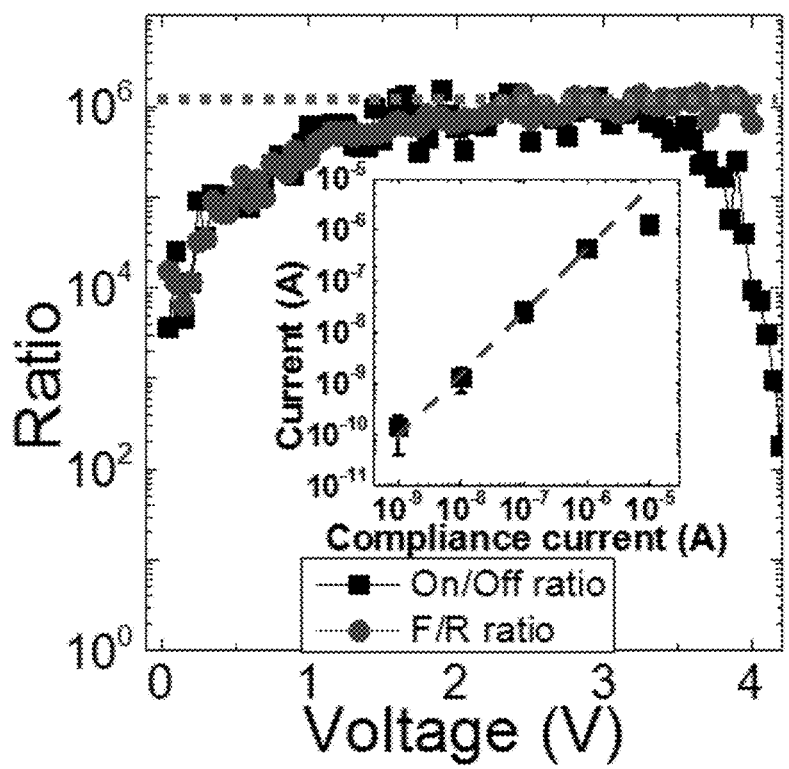
Figure 3C:
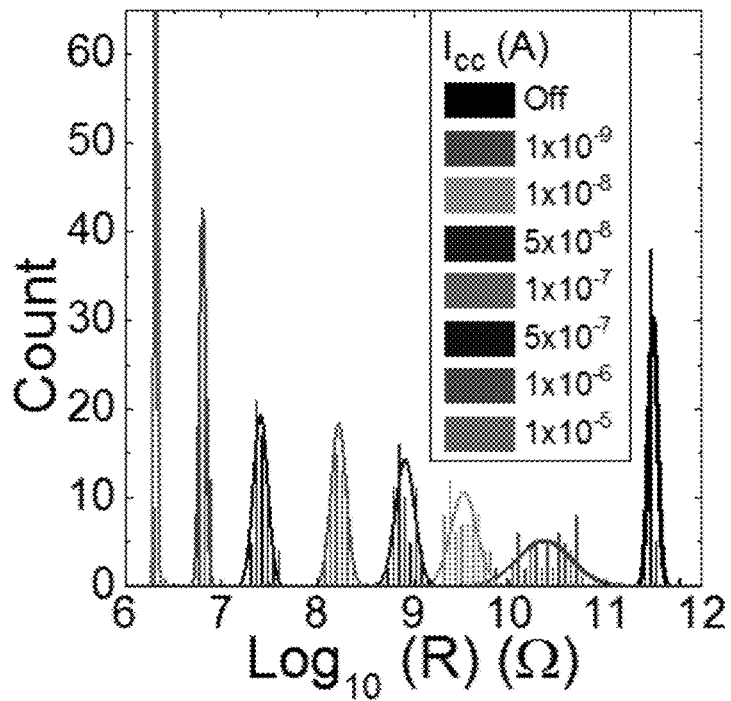
Figure 3D:
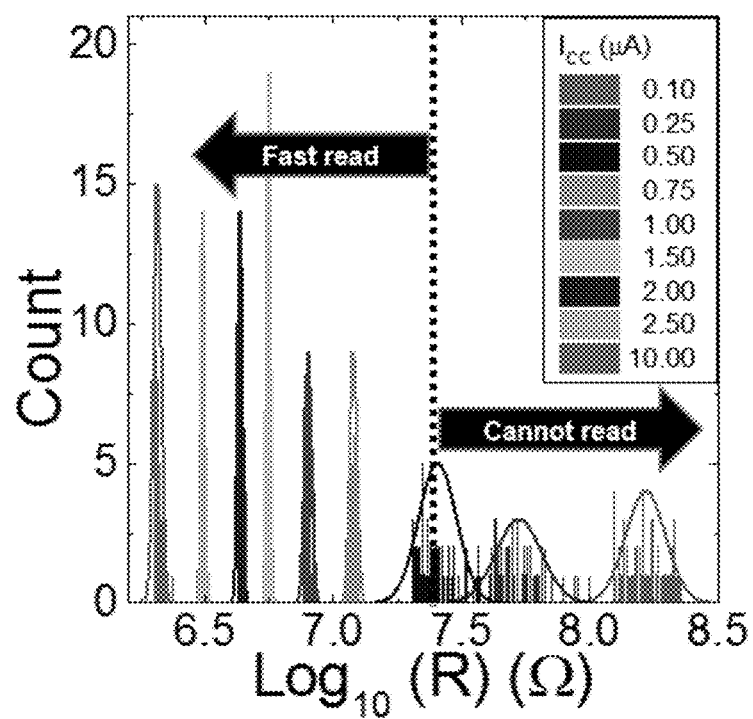
Figure 3E:
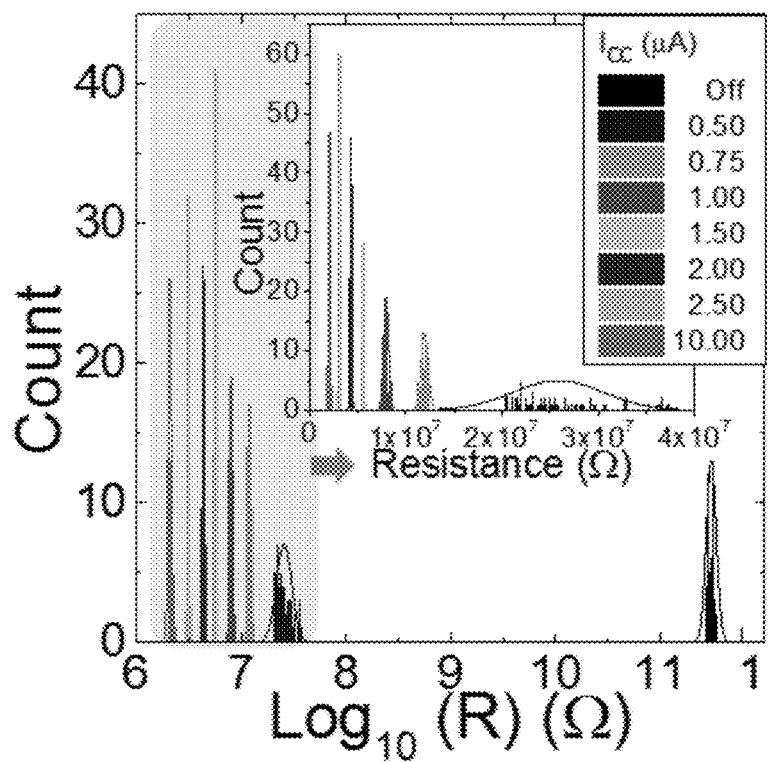

FIGS. 3A through 3E are graphs showing electric characteristics of a variable resistor according to an embodiment. FIG. 3A shows a current-voltage characteristic, FIG. 3B shows a self-rectification characteristic, FIG. 3C shows resistance levels for implementing multi-bits memory device, and FIGS. 3D and 3E show distributions of resistance levels in 8 ON states obtained in case of sweeping to I$_{cc}$ having a different values. The variable resistor has a size of 4 $\mu$m$^2$, where a tantalum oxide (Ta$_2$O$_5$) film is formed in a plasma enhanced atomic layer deposition, whereas an oxygen-deficient hafnium oxide (HfO$_{2-x}$) film is formed in a thermal atomic layer deposition.

A defect of the oxygen-deficient hafnium oxide film is formed during the plasma-enhanced atomic layer deposition for forming the tantalum oxide film, where the oxygen-deficient hafnium oxide film dominantly or preferentially has a monoclinic crystalline structure. The tantalum oxide (Ta$_2$O$_5$) film has an amorphous structure. Each of the tantalum oxide (Ta$_2$O$_5$) film and the oxygen-deficient hafnium oxide (HfO$_{2-x}$) film may have a thickness of about 10 nm. Thickness of an oxygen-deficient titanium oxide may be about 5 nm. However, the thicknesses of the above-stated films are merely example, and the example of the present invention is not limited thereto. Thicknesses of the above-stated films may be adjusted within the scope of the present invention in order to providing the self-rectification characteristic and the change of resistance values as described below.

Referring to FIG. 3A, an I-V sweep for checking resistive switching with respect to the variable resistor is performed as a positive bias is applied to a top electrode and a bottom electrode is electrically grounded. A variable resistor is initially OFF and exhibits a low leakage current of about $10^{-12}$ A. The leakage current may be caused by an initially empty charge trap of the oxygen-deficient hafnium oxide (HfO$_{2-x}$) film.

While a voltage applied to the variable resistor is increasing to 8V, a current suddenly increases at about 4V. The reason thereof may be that all of traps of the oxygen-deficient hafnium oxide (HfO$_{2-x}$) film are filled. Here, the variable resistor is in ON-state (may correspond to a set switching state) exhibiting the maximum current from about 1 $\mu$A to about 2 $\mu$A. No settlement of a compliance current I$_{cc}$ is observed. Therefore, it is clear that the variable resistor has a self-compliance behavior. The self-compliance behavior may be caused by the series resistance effect of the tantalum oxide (Ta$_2$O$_5$) film. Furthermore, an effect of the height of a Schottky barrier at the interface between the second electrode including platinum and the tantalum oxide film on transmission of charges is relatively small. The reason thereof is that, since conduction band of a hafnium oxide film is higher than that of a tantalum oxide film, charges injected to the conduction band of the hafnium oxide film from the first electrode including titanium are less affected by the Schottky barrier and, rather, are more affected by charge scattering effect inside the tantalum oxide (Ta$_2$O$_5$) film that functions as a series resistor.

Since trap centers of the oxygen-deficient hafnium oxide film are already filled with previously-injected electrons, if more electrons are injected, the electrons may flow via the conduction band, where ON-state may be maintained as long as charges trapped inside the hafnium oxide film are retained. When the bias decreases, a current is maintained at a high level (about 1 $\mu$A) to a voltage of 2 V and is rapidly dropped at a voltage equal to or lower than 1 V (see the curve 2). When the bias is reversed and a negative bias is applied, a leakage current is blocked by a Schottky barrier at the interface between a platinum electrode and a tantalum oxide film so that no current flows at voltages up to −4V (see the curve 3). When a bias voltage increases from −4 V to 4 V, a low current (about $10^{-12}$ A) is maintained. It may mean that the variable resistor is in OFF state (reset process) (see the curve 4). Next, when the bias voltage increases to +8V, the I-V characteristic exactly complies with the curve 1 (see curve 5).

Based on the I-V result of FIG. 3A, it is clear that the variable resistor according to an embodiment exhibits electroforming-free bipolar resistive switching characteristic. Furthermore, the tantalum oxide film having a stoichiometric composition contacts the second electrode including platinum having a high work function, and, accordingly, secures a high self-rectification characteristic due to a Schottky barrier. The interfaces between the oxygen-deficient hafnium oxide ($HfO_{2-x}$) film/the oxygen-deficient titanium oxide ($TiO_x$) film/Ti electrode (the first electrode) exhibit quasi-ohmic characteristic and provide an enhanced charge injecting interface when a negative bias is applied thereto. Therefore, a resistive switching mechanism simpler than a conventional ionic resistive switching mechanism may be provided.

Referring to FIG. 3B, an ON/OFF ratio and a rectification ratio (F/R ratio) of the variable resistor are illustrated, where the ratios may be obtained from the I-V curves of FIG. 3A. Currents may be read at 2.5 V, where values of the currents are different from that of an ON-current obtained by sweeping $I_{cc}$ by about $10^4$. Actually, as indicated by the dotted line, a reading current at each $I_{cc}$ is close to $I_{cc}$.

Referring to FIG. 3C, distributions of various ON-state resistances and OFF-state resistances are obtained at 2.5V. The distributions are obtained as a result of 60 sweeps at each $I_{cc}$ values. Distributions of ON-state resistances and OFF-state resistances induced by relatively large $I_{cc}$ are relatively narrow. It means than various resistant states have high uniformity. Based on an extrapolation of an OFF current, it may be determined that actual OFF-state resistances are within a range from about $10^{14}\Omega$ to about $10^{15}\Omega$. Distributions of ON-state resistances may be slightly degraded at smaller $I_{cc}$ values due to a larger statistical distribution of charge trappings when the entire number of carrier traps decreases.

Referring to FIG. 3D, a result similar to that shown in FIG. 3C is obtained by sweeping to $I_{cc}$ values in a narrow range from about 0.1 µA to about 10 µA. Referring to FIG. 3E, a distribution of resistances is obtained by sweeping to $I_{cc}$ currents in a narrow range from about 0.5 µA to about 10 µA. Since the 8th resistance state is significantly different from the other 7 resistance states, the 7 resistances may likely be determined as a single state by a normal sense amplifier. It may be necessary to introduce a new circuit for a common sense amplifier to use all 8 states. Detailed description thereof will be omitted with reference to FIG. 4A.

Figure 4A:
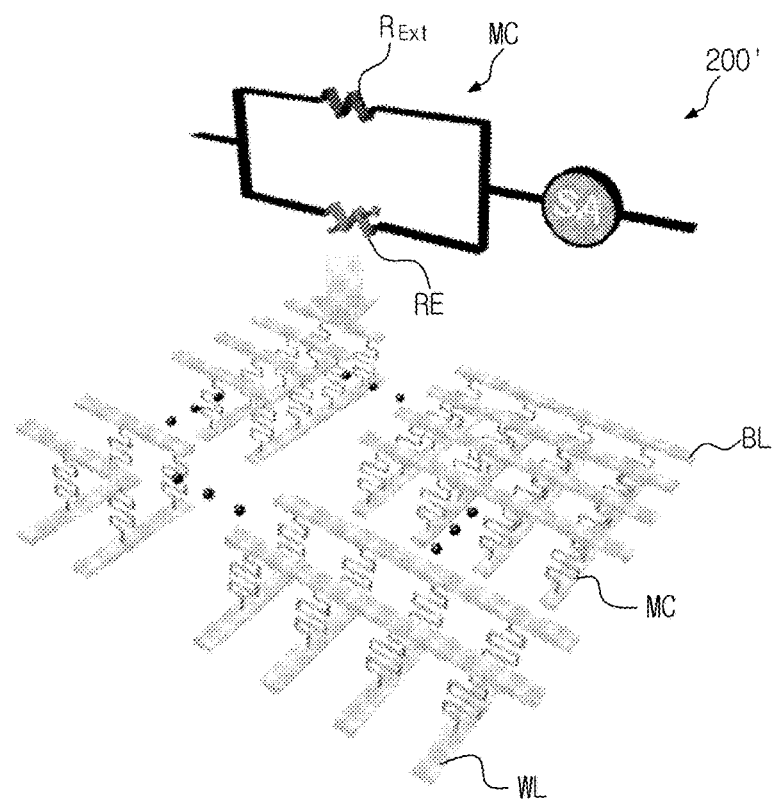
FIG. 4A is an equivalent circuit diagram of a memory cell according to an embodiment.
Figure 4B:
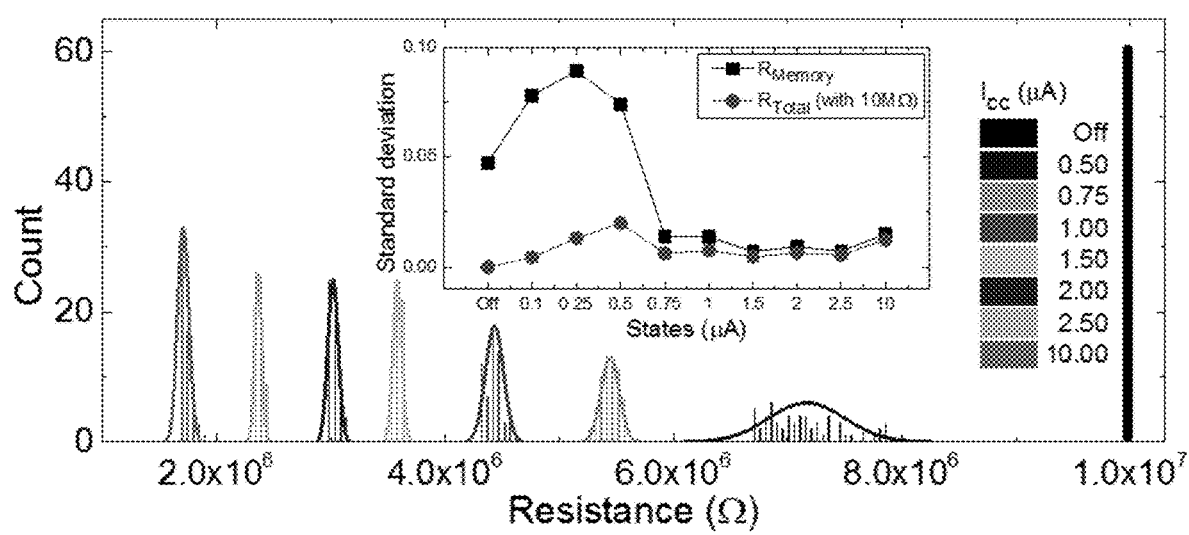
FIG. 4B is a graph showing a distribution of resistances of a memory cell having an external resistor REXt of 10 MΩ.

FIG. 4A is an equivalent circuit diagram of a memory cell according to an embodiment, and FIG. 4B is a graph showing a distribution of resistances of a memory cell having an external resistor $R_{EXt}$ of 10 MΩ. The graph inserted to FIG. 4B shows standard deviations of distributions of $R_{Memory}$ and $R_{Tot}$.

Referring to FIG. 4A, in order to distinguish 8 resistances of a variable resistor from one another by increasing sensitivity of sensing the 8 resistances as shown in FIG. 3E, a memory cell may further include an external resistor $R_{Ext}$ connected to an array of the memory cell in parallel. A value of the external resistor $R_{Ext}$ may be selected based on a total resistance $R_{Tot}$ of the memory cell that is determined according to Equation 1.

$$R_{Tot} = \left( \frac{1}{R_{Ext}} + \frac{1}{R_{Memory}} \right) \quad \text{[Equation 1]}$$

Here, $R_{Tot}$ denotes a total resistance of the memory cell, $R_{Memory}$ denotes a resistance of a variable resistor, and $R_{Ext}$ denotes a resistance of an external resistor connected to the variable resistor in parallel. The external resistor may be provided at an end of a bit-line or an input terminal of a sense amplifier and shared by arrays of all memory cells. Leakage currents from unselected cells may be ignored by a high F/R ratio of memory cells, where resistance of a selected memory cell may become $R_{Tot}$.

Referring to FIG. 4B, $R_{Memory}$ shows a large standard distribution to 0.1 when $I_{cc}$<0.5 µA, where the standard deviation of $R_{Memory}$ is reduced by applying $R_{Ext}$. In a circuit configuration according to an embodiment, standard distributions of all resistance states may be maintained to be smaller than 0.02. Furthermore, within such narrow ranges of resistances, 8 states may be clearly distinguished from one another without overlapping one another so that the 8 states can be utilized to realize multi-bits memories.

Figure 5:
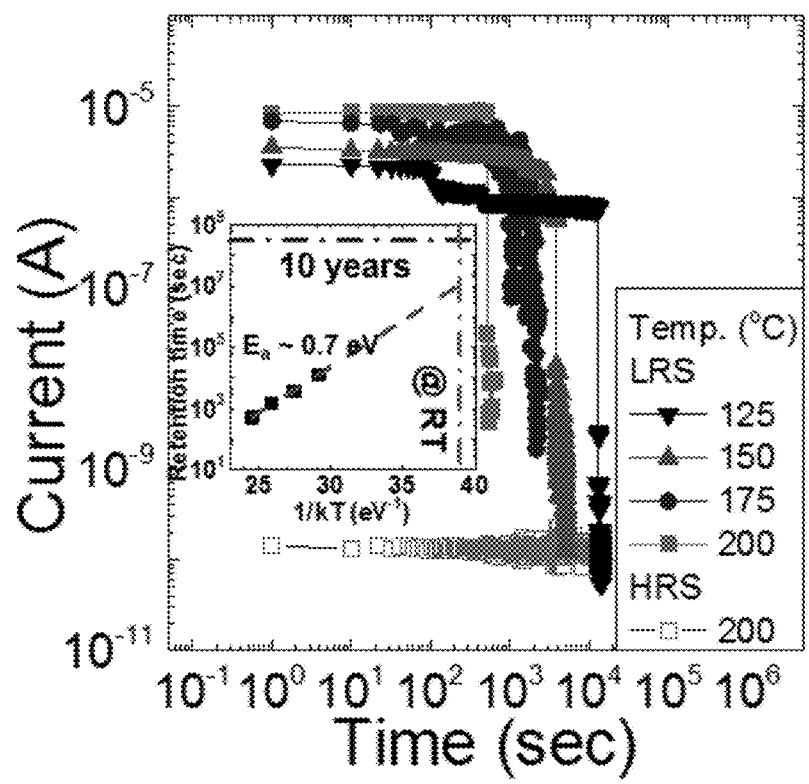
FIG. 5 is a graph showing ON currents and OFF currents of a variable resistor according to an embodiment at different temperatures from about 125° C. to about 200° C.

FIG. 5 is a graph showing ON currents and OFF currents of a variable resistor according to an embodiment at different temperatures from about 125° C. to about 200° C.

Referring to FIG. 5, data retention in OFF state is measured at 200° C., where there is no current change for 104 seconds. However, as time lapses, a current drastically decreases, because de-trapping of charges from trap centers inside a hafnium oxide film is thermally induced.

To evaluate data retention and de-trapping activating energy at the room temperature, time periods elapsed for drastic decrease of the current at respective temperatures are considered as retention times, and thus an Arrhenius graph is obtained (see the inserted graph). De-trapping activating energy related to retention characteristics is about 0.7 eV. The activating energy is consistent to an evaluated trap depth of the oxygen-deficient hafnium oxide ($HfO_{2-x}$) film, and thus it is clear that a resistive switching mechanism according to an embodiment is related to trapping/detrapping of charges injected by a first electrode including titanium. According to an embodiment, retention ability may be further improved by providing additional trap centers by additionally stacking a low band gap oxide film, such as a $TiO_x$ film or a $SiN_x$ film, in a variable resistor.

Figure 6A:
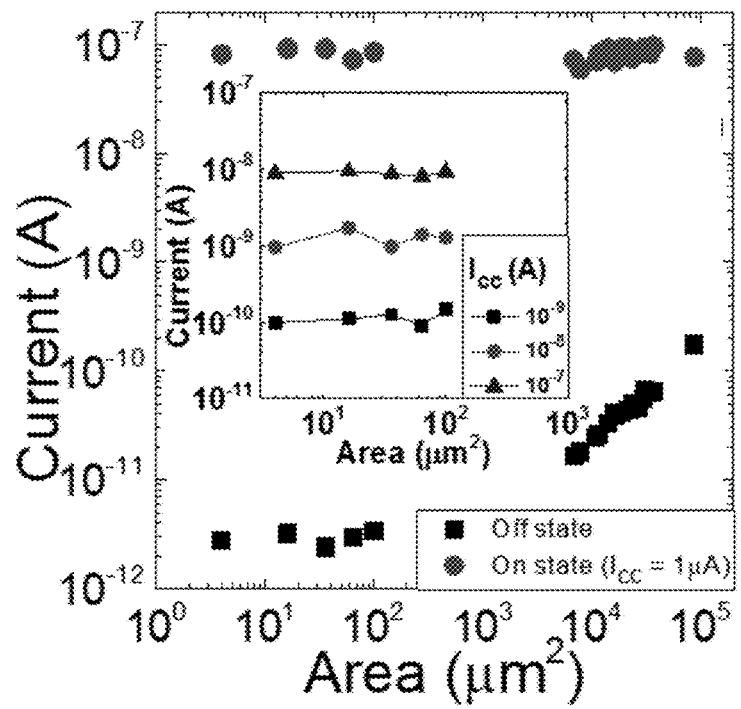
FIG. 6A shows current changes in ON state and OFF state as an electrode area of a variable resistor according to an embodiment is reduced from 105 $\mu m^2$ to 4 $\mu m^2$.
Figure 6B:
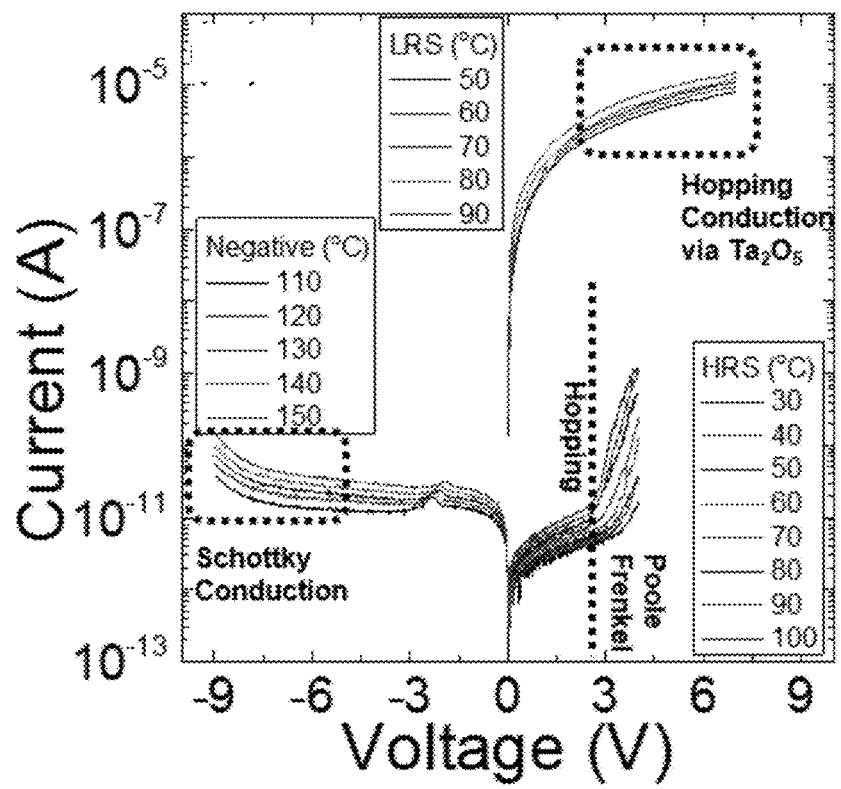
FIG. 6B is a graph showing I-V characteristics in ON state, OFF state, or reversely biased state measured at different temperatures.

FIG. 6A shows current changes in ON state and OFF state as an electrode area of a variable resistor according to an embodiment is reduced from 105 µm² to 4 µm², and FIG. 6B is a graph showing I-V characteristics in ON state, OFF state, or reversely biased state measured at different temperatures. In order to figure out a resistive switching mechanism of the variable resistor, conduction mechanisms regarding OFF state, mostly ON state, and reversely biased state (a negative bias is applied to a second electrode) are observed.

Referring to FIG. 6A, a current change in ON state evaluated as $I_{cc}$ of I µA is not dependent on a change of an entire electrode size and indicates that there is a local area to which most of charges are injected. Furthermore, it is necessary for a behavior that does not need an electroforming to induce such a conductive path throughout a device fabricating process. Preferably, the behavior may occur by an irregular interface between an oxide film and a titanium electrode that are stacked. A current change in OFF state has an area dependency from $10^5$ µm² to $10^3$ µm² with respect to a change of an entire electrode size. Furthermore, when a tendency of depending on an electrode area is extrapolated to 4 µm², not only a reverse leakage current, but also an OFF current from $10^{-14}$ A to $10^{-15}$ A may be obtained in a negatively biased state. The current change in OFF state indicates that an OFF current uniformly flows throughout an entire electrode and, then, becomes not dependent on an electrode area. Therefore, the F/R ratio shown in FIG. 4B is substantially greater than $10^6$. Furthermore, in FIG. 6A, ON currents independent from an electrode area are 1, 10, and 10 nA.

Referring to FIG. 6B, an I-V curve in OFF state is measured by sweeping to −4V. In all states, current conductions comply with a thermal activating mechanism. In a positive bias region, in OFF state, a current flows in a low voltage region (LVR<3V) via hopping trap sites. As a voltage increases, charge density in conduction band of a hafnium oxide film increases, a current flows in the conduction band, and abundance of traps having a trap depth of 0.75 eV may induce a Poole-Frenkel (P-F) emission conduction mechanism in a high voltage region (HVR>3V).

If a sufficient amount of charges are injected at a sufficiently high positive voltage, all of traps in a hafnium oxide film will be filled with electrons, and a variable resistor will be in ON state. In ON state, charges will be smoothly transmitted via the hafnium oxide film, and a hopping conduction via trap sites in a tantalum oxide film will dominate current conductions. A conduction characteristic not dependent on an electrode area indicates that a current flows through a spatially localized region, e.g., a charge trapping site in the hafnium oxide film. In a negative bias region, the overall leakage current may be well suppressed by a Schottky barrier between platinum and a tantalum oxide film. Based on the Schottky barrier, a variable resistor according to an embodiment exhibits a self-rectification characteristic.

When a platinum electrode is sufficiently negatively biased (<about 4V), electrons trapped inside a hafnium oxide film will be de-trapped, and charges injected from the platinum electrode will be suppressed. The operation switches the variable resistor to OFF state. Therefore, a variable resistor according to an embodiment exhibits a behavior similar to that of a flash memory in which charges are trapped and de-trapped by charge trapping flash memory cells, charges are transmitted between a charge trapping layer and a silicon channel via a tunneling insulation film, and movement of charges between the charge trapping layer and a control gate is severely restricted by a blocking insulation film. Furthermore, in a variable resistor, it seems that a hafnium oxide film functions as both a tunneling insulation film and a charge trapping layer. Furthermore, it seems that an interface between a platinum electrode and a tantalum oxide film functions as a blocking insulation film in negatively biased state.

Figure 7A:
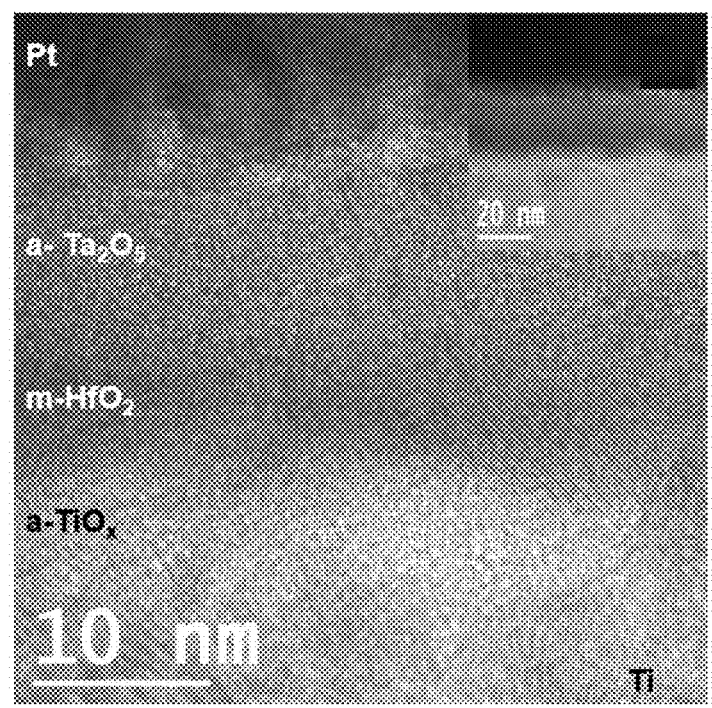
FIG. 7A is a transmission electron microscopy image of a variable resistor according to an embodiment.
Figure 7B:
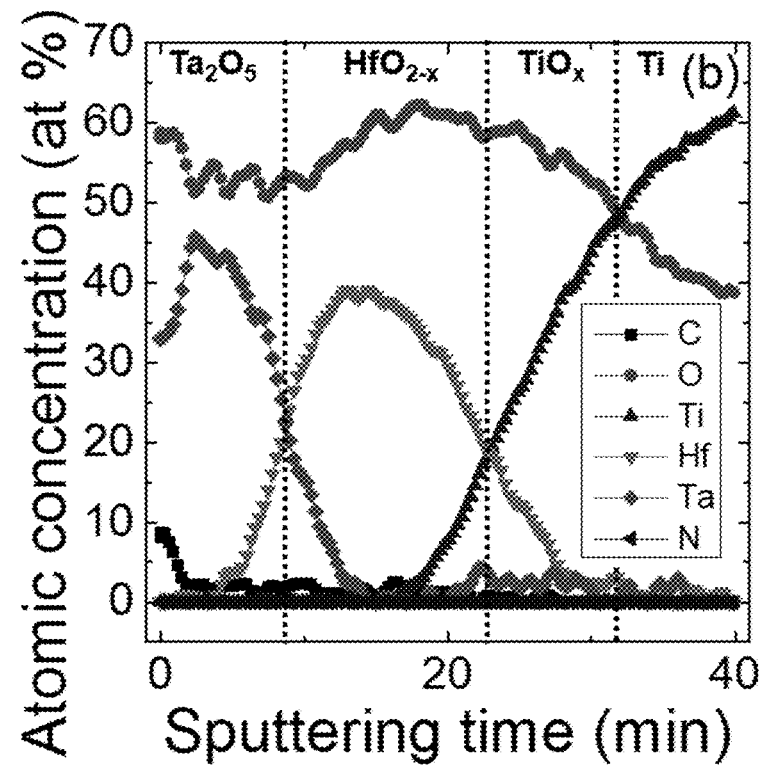
FIG. 7B is an Auger electron microscopy (AES) image of a platinum electrode/tantalum oxide film ($Ta_2O_5$, 10 nm in thickness)/hafnium oxide film ($HfO_x$, 10 nm in thickness)

FIG. 7A is a transmission electron microscopy image of a variable resistor according to an embodiment, and FIG. 7B is an Auger electron microscopy (AES) image of a platinum electrode/tantalum oxide film ($Ta_2O_5$, 10 nm)/hafnium oxide film ($HfO_x$, 10 nm).

Referring to FIGS. 7A and 7B, the tantalum oxide ($Ta_2O_5$) film is amorphous, the hafnium oxide film is crystalline, a titanium oxide film is amorphous, and an amorphous titanium oxide ($TiO_x$) film having a thickness of about 5 nm is formed between the monoclinic hafnium oxide film and a crystalline titanium electrode. Since titanium has excellent reactivity, a hafnium oxide ($HfO_2$) film formed by atomic layer deposition may react the underlying titanium electrode, and thus a deflective titanium oxide ($TiO_x$) film including an oxygen vacancy $V_o$ may be formed in the hafnium oxide film nearby the interface therebetween. According to an embodiment, the defect region including the oxygen vacancy is expected to be formed at an interface with the tantalum oxide film in case of applying a deposition technique, such as plasma enhanced CVD for inducing a defect.

Figure 8A:
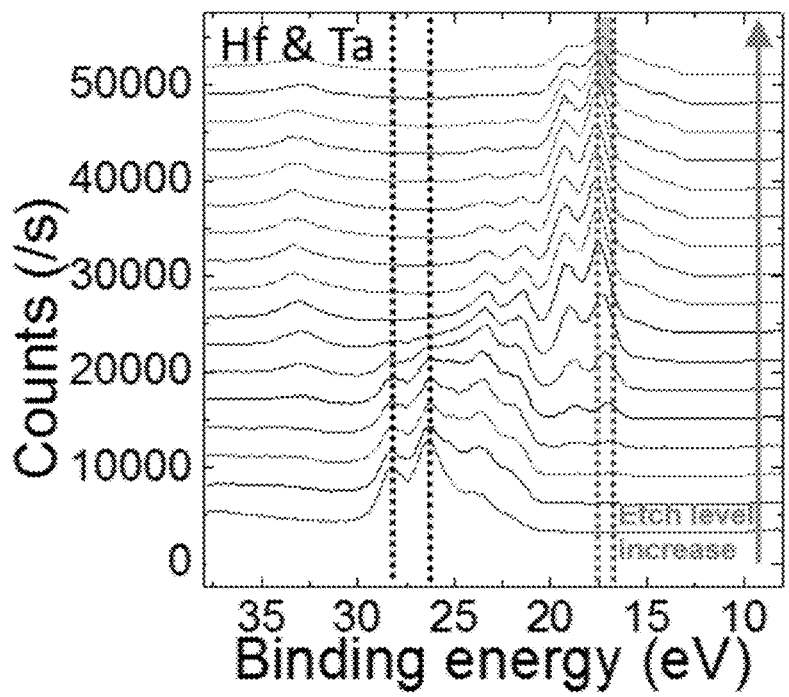
FIG. 8A is a diagram showing XPS depth profile data for hafnium (Hf) 4 f/tantalum (Ta) 4 f core levels in a structure of tantalum oxide ($Ta_2O_5$) film/hafnium oxide ($HfO_2$; 10 nm) film/Ti electrode.
Figure 8B:
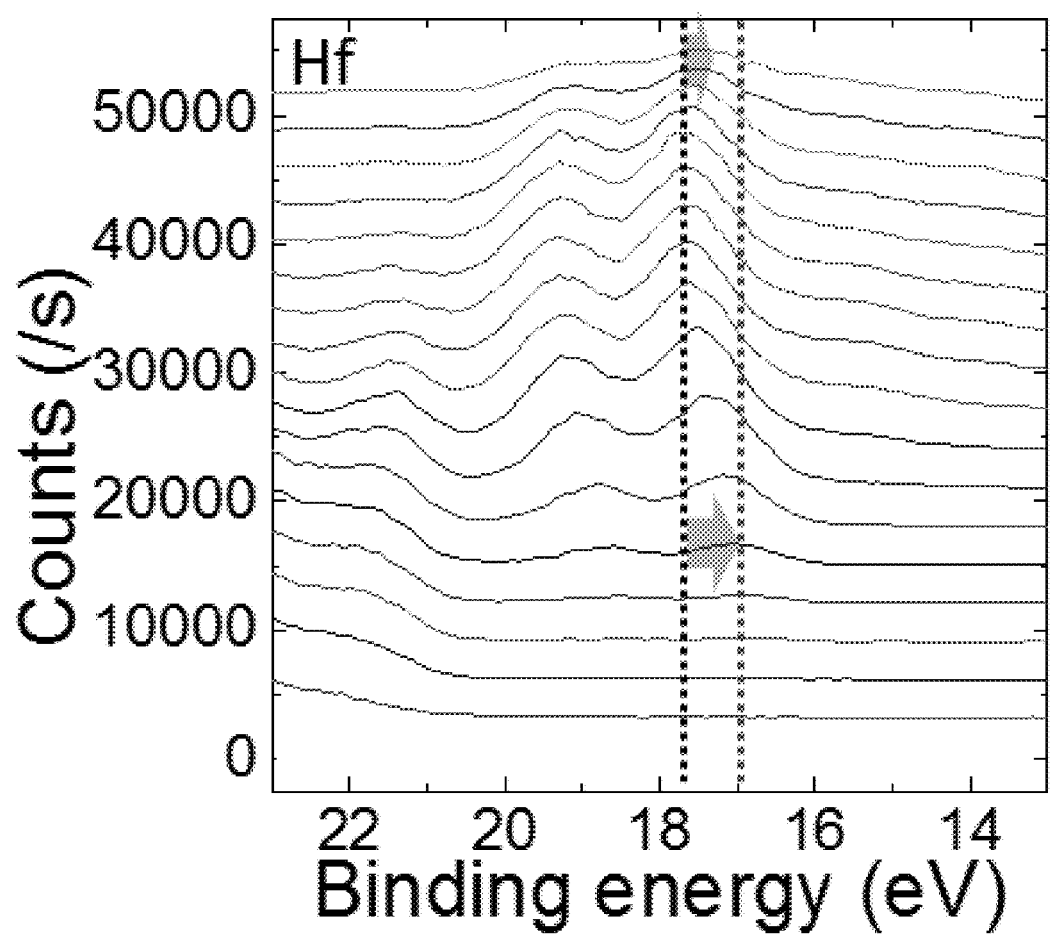
FIG. 8B shows a magnified image of the hafnium 4 f core level in the graph shown in FIG. 5A.

FIG. 8A is a diagram showing XPS depth profile data regarding hafnium (Hf) 4 f/tantalum (Ta) 4 f core levels in a tantalum oxide ($Ta_2O_5$) film/hafnium oxide ($HfO_2$; 10 nm) film/Ti electrode structure, and FIG. 8B shows a magnified image of the hafnium 4 f core level in the graph shown in FIG. 5A.

Referring to FIG. 8A, binding energy of titanium 4 f is identical to a reference value of about 26.2 eV (26.2 eV in case of Ta 4 f1/2 and 28.1 eV in case of Ta 4 f5/2). The result supports that a tantalum oxide film maintains a stoichiometric composition and may be embodied, since a hafnium oxide film between a titanium electrode and the tantalum oxide film blocks chemical reactivity of a titanium electrode.

Referring to FIG. 8B, unlike tantalum, two remarkable changes are seen between a tantalum oxide film and a hafnium oxide film and between the hafnium oxide film and a titanium electrode at 4 f of hafnium (Hf). Nearby the tantalum oxide film, binding energy of the hafnium 4 f core level is transited toward lower binding energy. The result supports that an oxygen-deficient hafnium oxide ($HfO_{2-x}$) film is formed nearby a tantalum oxide film during deposition of the tantalum oxide film. At the mid portion of the hafnium oxide film, binding energy of hafnium 4 f is maintained at a value corresponding to binding energy of a completely oxidized hafnium oxide ($HfO_2$) film. This is attributed to the formation of an oxygen vacancy $V_o$ induced nearby an interface by a chemical reaction with an underlying titanium electrode. If a titanium nitride electrode is employed instead of a titanium electrode, reduction of a hafnium oxide film is not observed.

A variable resistor according to an embodiment obtains a stacked structure including an oxygen-deficient titanium oxide film and an oxygen-deficient hafnium oxide film by employing a titanium electrode, which is a reactive electrode, thereby improving charge injection characteristics during a setting operation and minimizing adverse effects on a Schottky barrier between a platinum electrode and a tantalum oxide film and OFF state. As a result, according to an embodiment, a variable resistor that does not require an electroforming process and exhibits high uniformity, multi-level switching operation capability, low operation voltage, low power consumption, and self-rectification characteristic may be provided. By using such a variable resistor, a cross-point non-volatile memory device capable of embodying a multi-level cell may be provided.

Various non-volatile memory devices described above with reference to the drawings attached to the present specification may be embodied as a single memory device or in the form of system-on-chip (SOC) by being arranged together with other types of devices, e.g., a logic processor, an image sensor, a RF device, etc., within a single wafer chip. Alternatively, a wafer chip having formed thereon a non-volatile memory device and another wafer chip having formed thereon other types of devices may be adhered to each other by using an adhesive, a soldering, or a wafer bonding technique, thereby embodying a single chip.

Furthermore, the non-volatile memory devices according to the above-stated embodiments may be embodied as any of various types of semiconductor packages. For example, non-volatile memory devices according to embodiments may be packaged as package on package (PoP), ball grid arrays (BGAs), chip scale packages (CSPs), plastic leaded chip carrier (PLCC), plastic dual in-line package (PDIP), die in waffle pack, die in wafer FoSM, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi-chip package (MCP), wafer-level fabricated package (WFP), or wafer-level processed stack package (WSP). Packages on which non-volatile memory devices according to embodiments are mounted may further include controllers and/or logic devices for controlling the memory devices.

Figure 9:
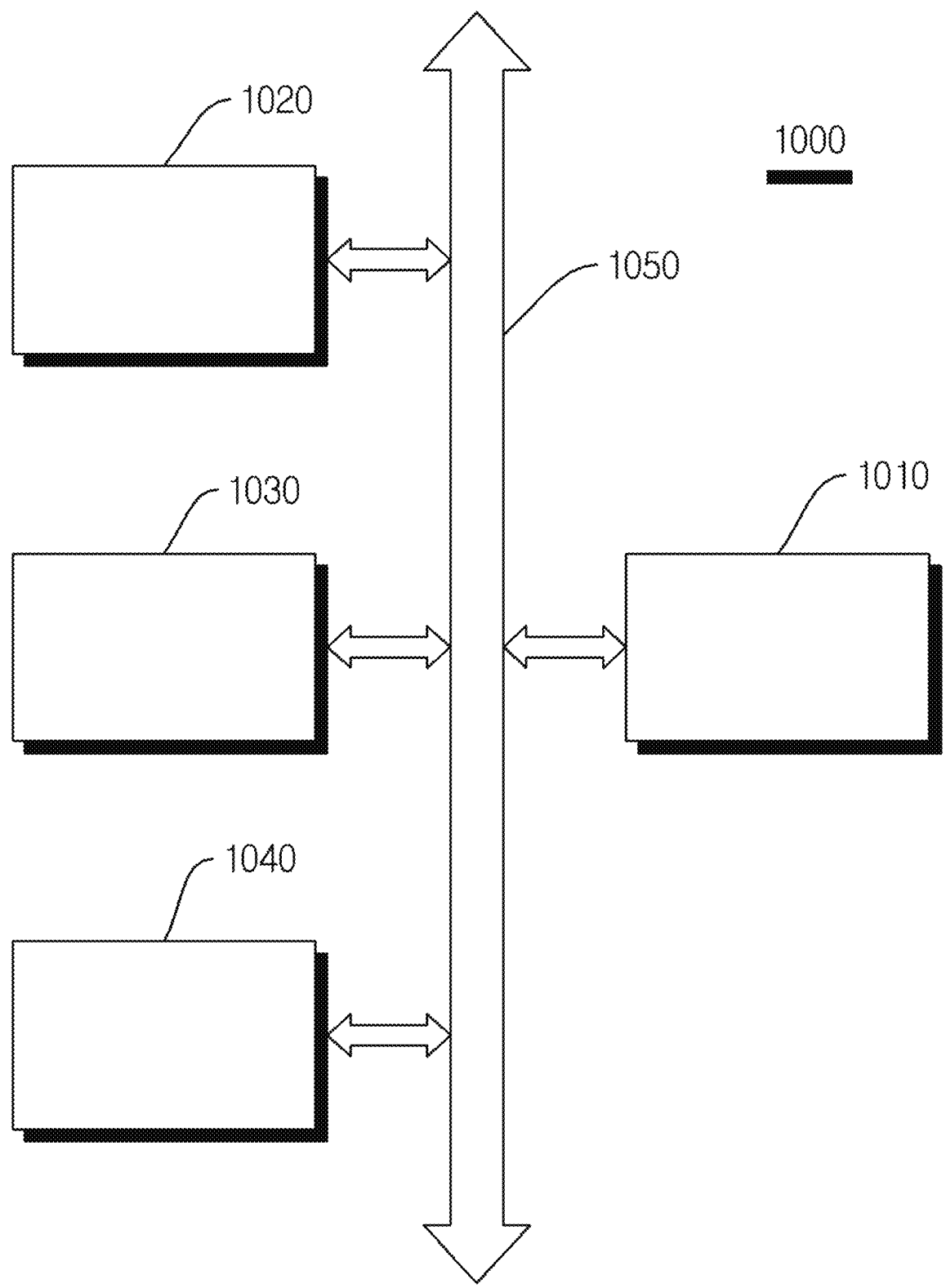
FIG. 9 is a block diagram showing an electronic system including a non-volatile memory device according to an embodiment of the present invention.

FIG. 9 is a block diagram showing an electronic system 1000 including a non-volatile memory device according to an embodiment of the present invention.

Referring to FIG. 9, the electronic system 1000 may include a controller 1010, an I/O device 1020, a storage device 1030, an interface 1040, and a bus 1050. The controller 1010, the I/O device 1020, the storage device 1030, and/or the interface 1040 may be combined with one another via the bus 1050.

The controller 1010 may include at least one from among a microprocessor, a digital signal processor, a micro controller, and other logic devices providing similar functions. The I/O device 1020 may include a keypad, a keyboard, a display device, etc. The storage device 1030 may store data and/or instructions. The storage device 1030 may include a 3D non-volatile memory device disclosed in the present specification.

According to embodiments, the memory device 1030 may have a hybrid structure further including other types of semiconductor memory devices (e.g., DRAM devices and/or SRAM devices). The interface 1040 may transmit data to a communication network or receive data from a communication network. The interface 1040 may be a wired interface or a wireless interface. For example, the interface 1040 may include an antenna or a wired/wireless transceiver. Although not shown, the electronic system 1000 may further include a high speed DRAM and/or SRAM as an operation memory for improving operation of the controller 1010.

The electronic system 1000 may be applied to a personal digital assistant (PDA), a portable computer, a tablet PC, a wireless phone, a mobile phone, a digital music player, a memory card, a solid-state drive (SSD), a computer, a display device, an input unit, such as a digitizer and a mouse, or any of various other electronic devices capable of transmitting and/or receiving data wirelessly.

Figure 10:
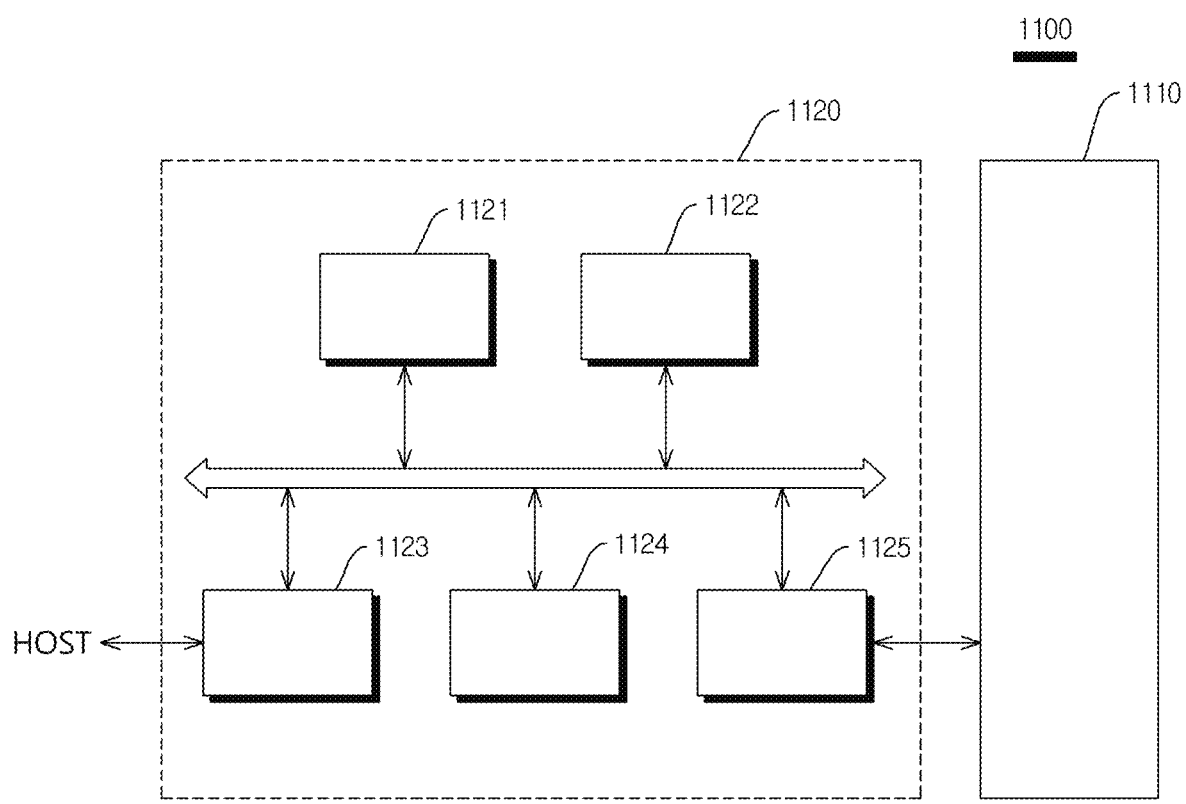
FIG. 10 is a block diagram showing a memory card including a non-volatile memory device according to embodiments.

FIG. 10 is a block diagram showing a memory card 1100 including a non-volatile memory device according to embodiments.

Referring to FIG. 10, the memory card 1100 according to an embodiment includes a memory device 1110. The memory device 1110 may include at least one of non-volatile memory devices according to the inventive concept. Furthermore, the memory device 1110 may further include one of other types of semiconductor memory devices (e.g., DRAM devices and/or SRAM devices). The memory card 1100 may include a memory controller 1120 that controls data exchanges between a host and the memory device 1110.

The memory controller 1120 may include a central processing unit (CPU) 1122 that controls the overall operations of the memory card 1100. The memory controller 1120 may include a SRAM 1121 that is used by the CPU 1122 as an operation memory. The memory controller 1120 may further include a host interface 1123 and a memory interface 1125. The host interface 1123 may include a protocol for exchanging data between the memory card 1100 and the host. The memory interface 1125 may connect the memory controller 1120 and the memory device 1110 to each other. Furthermore, the memory controller 1120 may further include an error correcting block (ECC) 1124. The ECC 1124 may detect and correct an error in data read out from the memory device 1110. Although not shown, the memory card 1100 may further include a ROM device that stores code data for interfacing with the host. The memory card 1100 may be used as a portable data storage card. Such the memory card 1100 includes a non-volatile memory device and may also be embodied as a solid state disk (SSD) that may replace a hard disk drive of a computer system.

Although the above-stated embodiments relate to memory devices, they are merely examples, and it would be obvious to one of ordinary skill in the art that a variable resistor according to an embodiment may also be applied as a fuse, an anti-fuse, or an ON/OFF switching device for a logic circuit like a FPGA.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A variable resistor comprising:
a first electrode comprising titanium (Ti);
a second electrode including a non-reactive noble metal which is different from the first electrode; and
a stacked structure that comprises:
an oxygen-deficient hafnium oxide film ($HfO_{2-x}$, $0<x<2$) having a monoclinic crystalline structure between the first electrode and the second electrode, the oxygen-deficient hafnium oxide film ($HfO_{2-x}$) having trap centers for trapping and de-trapping of electrons injected from the first electrode;
an oxygen-deficient titanium oxide ($TiO_x$) film having an amorphous structure between the oxygen-deficient hafnium oxide film and the first electrode; and
a stoichiometric tantalum oxide ($Ta_2O_5$) film having an amorphous structure between the oxygen-deficient hafnium oxide film and the second electrode, the stoichiometric tantalum oxide ($Ta_2O_5$) film providing a schottky barrier together with the second electrode,
wherein a first interface between the first electrode and the oxygen-deficient titanium oxide ($TiO_x$) film provides a first charge injecting interface and has a first quasi-ohmic characteristic and wherein a second interface between the oxygen-deficient titanium oxide ($TiO_x$) film and the oxygen-deficient hafnium oxide film ($HfO_{2-x}$) provides a second charge injecting interface and has second quasi-ohmic characteristic,
wherein a total amount of oxygen in the oxygen-deficient hafnium oxide film ($HfO_{2-x}$) and the oxygen-deficient titanium oxide ($TiO_x$) are identical to an amount of oxygen of a stoichiometric hafnium oxide ($HfO_2$) film,
wherein when a first bias is applied to the second electrode having a potential higher than that of the first electrode, the electrons injected through the first and the second charge injecting interfaces from the first electrode are trapped in the trap centers so that the variable resistor is in turn-on state,
wherein when a second bias is applied to the second electrode having a potential lower than that of the first electrode, the electrons which are trapped in the trap centers are de-trapped and other electrons injected from the second electrode are suppressed, so that the variable resistor is in turn-off state until a predetermined voltage difference value, wherein the current in the turn-on state of the variable resistor is based on a hopping conduction by trapping and de-trapping of charges at trap centers formed in the hafnium oxide film, wherein the schottky barrier between the stoichiometric tantalum oxide ($Ta_2O_5$) film and the second electrode has self-rectification characteristic.

2. The variable resistor of claim 1, wherein the second electrode comprises iridium (Ir), palladium (Pd), platinum (Pt), gold (Au), ruthenium (Ru), or an alloy thereof.

3. The variable resistor of claim 1, wherein the first electrode is a top electrode, and the second electrode is a bottom electrode.

4. A non-volatile memory device comprising an array of memory cells, wherein each memory cell comprises a variable resistor as a storage element, the variable resistor comprises:
   a first electrode comprising titanium (Ti);
   a second electrode including a non-reactive noble metal which is different from the first electrode; and
   a stacked structure that comprises:
      an oxygen-deficient hafnium oxide film ($HfO_{2-x}$, $0<x<2$) having a monoclinic crystalline structure between the first electrode and the second electrode, the oxygen-deficient hafnium oxide film ($HfO_{2-x}$) having trap centers for trapping and de-trapping of electrons injected from the first electrode;
      an oxygen-deficient titanium oxide ($TiO_x$) film having an amorphous structure between the oxygen-deficient hafnium oxide film and the first electrode; and
      a stoichiometric tantalum oxide ($Ta_2O_5$) film having an amorphous structure between the oxygen-deficient hafnium oxide film and the second electrode, the stoichiometric tantalum oxide ($Ta_2O_5$) film providing a schottky barrier together with the second electrode,
   wherein a first interface between the first electrode and the oxygen-deficient titanium oxide ($TiO_x$) film provides a first charge injecting interface and has a first quasi-ohmic characteristic and wherein a second interface between the oxygen-deficient titanium oxide ($TiO_x$) film and the oxygen-deficient hafnium oxide film ($HfO_{2-x}$) provides a second charge injecting interface and has second quasi-ohmic characteristic, wherein a total amount of oxygen in the oxygen-deficient hafnium oxide film ($HfO_{2-x}$) and the oxygen-deficient titanium oxide ($TiO_x$) are identical to an amount of oxygen of a stoichiometric hafnium oxide ($HfO_2$) film, wherein when a first bias is applied to the second electrode having a potential higher than that of the first electrode, the electrons injected through the first and the second charge injecting interfaces from the first electrode are trapped in the trap centers so that the variable resistor is in turn-on state, wherein when a second bias is applied to the second electrode having a potential lower than that of the first electrode, the electrons which are trapped in the trap centers are de-trapped and other electrons injected from the second electrode are suppressed, so that the variable resistor is in turn-off state until a predetermined voltage difference value, wherein the current in the turn-on state of the variable resistor is based on a hopping conduction by trapping and de-trapping of charges at trap centers formed in the hafnium oxide film, wherein the schottky barrier between the stoichiometric tantalum oxide ($Ta_2O_5$) film and the second electrode has self-rectification characteristic.

5. The non-volatile memory device of claim 4, wherein the array of memory cells has a cross-point structure.

6. The non-volatile memory device of claim 4, further comprising an external resistor connected to the array of memory cells in parallel.

7. The variable resistor of claim 1, wherein the variable resistor has an electro-forming-free bipolar resistive switching characteristic.

* * * * *